United States Patent
Liu et al.

(10) Patent No.: US 8,791,775 B2
(45) Date of Patent: *Jul. 29, 2014

(54) SEMICONDUCTOR DEVICE AND METHOD OF FORMING HIGH-ATTENUATION BALANCED BAND-PASS FILTER

(75) Inventors: Kai Liu, Phoenix, AZ (US); Robert C. Frye, Piscataway, NJ (US)

(73) Assignee: STATS ChipPAC, Ltd., Singapore (SG)

( * ) Notice: Subject to any disclaimer, the term of this patent is extended or adjusted under 35 U.S.C. 154(b) by 712 days.

This patent is subject to a terminal disclaimer.

(21) Appl. No.: 12/750,517

(22) Filed: Mar. 30, 2010

(65) Prior Publication Data

US 2011/0241163 A1 Oct. 6, 2011

(51) Int. Cl.
*H03H 7/09* (2006.01)
*H03H 7/42* (2006.01)
*H01F 17/00* (2006.01)

(52) U.S. Cl.
CPC . *H03H 7/09* (2013.01); *H03H 7/42* (2013.01); *H01F 17/0006* (2013.01)
USPC .......................................... 333/185; 333/204

(58) Field of Classification Search
CPC ........ H03H 7/09; H03H 7/42; H01F 17/0006; H01F 17/00; H01F 19/00
USPC ............ 333/26, 185, 175, 177, 178; 257/531; 336/200, 232
See application file for complete search history.

(56) References Cited

U.S. PATENT DOCUMENTS

| | | | |
|---|---|---|---|
| 5,017,897 A * | 5/1991 | Ooi et al. ........................ | 333/204 |
| 5,361,050 A * | 11/1994 | Einbinder ...................... | 333/204 |
| 5,477,204 A | 12/1995 | Li | |
| 6,762,655 B2 * | 7/2004 | Wichern ........................ | 333/175 |
| 6,803,835 B2 | 10/2004 | Frank | |
| 7,199,679 B2 | 4/2007 | Mondal | |
| 7,199,684 B2 | 4/2007 | Aigner et al. | |
| 7,256,663 B2 | 8/2007 | Yasuda et al. | |
| 7,629,860 B2 * | 12/2009 | Liu et al. ........................ | 333/25 |
| 8,143,976 B2 * | 3/2012 | Wyland ........................ | 333/260 |
| 8,576,026 B2 * | 11/2013 | Liu et al. ........................ | 333/204 |
| 2006/0284698 A1 * | 12/2006 | Vaisanen ........................ | 333/26 |
| 2008/0096516 A1 * | 4/2008 | Mun et al. ...................... | 455/341 |
| 2009/0167455 A1 | 7/2009 | Liu et al. | |
| 2010/0097155 A1 * | 4/2010 | Blair .............................. | 333/26 |

OTHER PUBLICATIONS

Stats ChipPAC, "802.11b/g Band Pass Filter (SCI-304 W/F)", IPD Products Databook, Integrated Passive Devices, 2nd Ed., 7 pages, 2009.

\* cited by examiner

*Primary Examiner* — Dean O Takaoka
*Assistant Examiner* — Alan Wong
(74) *Attorney, Agent, or Firm* — Robert D. Atkins; Atkins & Associates, P.C.

(57) ABSTRACT

A semiconductor device has a substrate and band-pass filter formed over the substrate. The band-pass filter includes a first conductive trace wound to exhibit inductive properties with a first end coupled to a first terminal of the semiconductor device and second end coupled to a second terminal of the semiconductor device, and first capacitor coupled between the first and second ends of the first conductive trace. A second conductive trace is wound to exhibit inductive properties with a first end coupled to a third terminal of the semiconductor device and second end coupled to a fourth terminal of the semiconductor device. The second conductive trace has a different size and shape as the first conductive trace. A second capacitor is coupled between the first and second ends of the second conductive trace. A third conductive trace is wound around the first and second conductive traces to exhibit inductive properties.

32 Claims, 6 Drawing Sheets

SEMICONDUCTOR DEVICE AND METHOD OF FORMING HIGH-ATTENUATION BALANCED BAND-PASS FILTER

FIELD OF THE INVENTION

The present invention relates in general to semiconductor devices and, more particularly, to a semiconductor device and method of forming high-attenuation balanced band-pass filter.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions.

Baluns (balanced and unbalanced) and RF band-pass filters are important components in wireless communication systems. The balun suppresses electrical noise, performs impedance transformation and matching, and minimizes common-mode noise through electromagnetic coupling. The band-pass filter removes unwanted noise or interference from open air environment and signal paths by passing signals with a designated bandwidth and suppresses signals outside the pass-band.

A conventional RF band-pass filter 10 is shown in FIG. 1 implemented using LC (inductor and capacitor) resonators. An inductor or coil 12 includes first and second end terminals coupled to port 14 and port 16. In one embodiment, port 14 is a single-ended unbalanced port and port 16 is a ground terminal. Alternatively, port 16 is a single-ended unbalanced port and port 14 is the ground terminal. A capacitor 18 is coupled between port 14 and port 16. The inductor 12 and capacitor 18 constitute a first LC resonator. An inductor or coil 20 includes first and second end terminals coupled to balanced ports 22 and 24. A capacitor 26 is coupled between balanced ports 22 and 24. The inductor 20 and capacitor 26 constitute a second LC resonator. An inductor or coil 28 includes end terminals 30 and 32. A capacitor 34 is coupled in series between end terminals 30 and 32 of inductor 28. The inductor 28 and capacitor 34 constitute a third LC resonator. The inductor 28 is formed around a perimeter of inductors 12 and 20 non-overlapping with planar separation. The inductor 28 can have a larger, smaller, or symmetrical value with inductors 12 and 20. The inductors 12 and 20 are the same size and shape, e.g., rectangular, polygonal, or circular, and are wound to create magnetic coupling.

Another conventional RF band-pass filter 36 is shown in FIG. 2. In this case, inductor or coil 37 has first and second end terminals coupled to port 38 and port 39. In one embodiment, port 38 is a single-ended unbalanced port and port 39 is a ground terminal. Alternatively, port 39 is the single-ended unbalanced port and port 38 is the ground terminal. A capacitor 40 is coupled between port 38 and port 39. The inductor 37 and capacitor 40 constitute a first LC resonator. An inductor or coil 41 includes first and second end terminals coupled to balanced ports 42 and 43. A capacitor 44 is coupled between balanced ports 42 and 43. The inductor 41 and capacitor 44 constitute a second LC resonator. An inductor or coil 45 includes end terminals 46 and 47. A capacitor 48 is coupled in series between end terminals 46 and 47 of inductor 41. The inductor 45 and capacitor 48 constitute a third LC resonator. The inductors 37 and 41 overlay inductor 45 with vertical electrical isolation and planar separations. The inductor 45 can have a larger, smaller, or symmetrical value with inductors 37 and 41. The inductors 37 and 41 are the same size and shape, e.g., rectangular, polygonal, or circular, and are wound to create magnetic coupling.

A high attenuation and rejection at the stop-bands and low insertion-loss at pass-band is preferred for optimal signal quality. For example, a WiMAX device in a cellular phone or WiFi application must have sufficient attenuation at the cellular phone band (800 MHz to 2100 MHz) and the WiFi band (4900 MHz to 5900 MHz). However, in a two-port band-pass filter, a balanced state is difficult to achieve. With input coil and output coil being the same size and shape, as described in FIGS. 1 and 2, the impedance transformation ratio is limited for non-50 Ohm matching, e.g., 100 Ohm or complex impedance. In addition, the same-size input and output coil typically cannot achieve the desired high attenuation and rejection response at stop-bands.

SUMMARY OF THE INVENTION

A need exists for an RF band-pass filter with high attenuation and rejection at the stop-bands and low insertion-loss at pass-band. Accordingly, in one embodiment, the present invention is a semiconductor device comprising a substrate and band-pass filter formed over the substrate. The band-pass filter includes a first conductive trace wound to exhibit inductive properties with a first end coupled to a first terminal of the semiconductor device and second end coupled to a second terminal of the semiconductor device, and first capacitor coupled between the first and second ends of the first conductive trace. The band-pass filter further includes a second conductive trace wound to exhibit inductive properties with a first end coupled to a third terminal of the semiconductor device and second end coupled to a fourth terminal of the semiconductor device, second capacitor coupled between the first and second ends of the second conductive trace, and third conductive trace wound around the first and second conductive traces to exhibit inductive properties. The second conductive trace has a different size and shape as the first conductive trace.

In another embodiment, the present invention is a semiconductor die comprising a substrate and first conductive trace formed over the substrate and wound to exhibit inductive properties with a first end coupled to a first terminal of the semiconductor device and second end coupled to a second terminal of the semiconductor device. A second conductive trace is formed over the substrate and wound to exhibit inductive properties with a first end coupled to a third terminal of the semiconductor device and second end coupled to a fourth terminal of the semiconductor device. The second conductive trace has a different size or shape as the first conductive trace. A third conductive trace is formed over the substrate and wound around the first and second conductive traces to exhibit inductive properties.

In another embodiment, the present invention is a semiconductor device comprising a substrate and first inductor formed on the substrate. A second inductor is formed on the substrate. The second inductor has a different size or shape as the first inductor. A third inductor is formed around the first and second inductors.

In another embodiment, the present invention is a method of forming a semiconductor die comprising the steps of providing a substrate and forming a first conductive trace over the substrate. The first conductive trace is wound to exhibit inductive properties with a first end coupled to a first terminal of the semiconductor device and second end coupled to a second terminal of the semiconductor device. The method further includes the steps of forming a second conductive trace over the substrate, and forming a third conductive trace over the substrate. The second conductive trace is wound to exhibit inductive properties with a first end coupled to a third terminal of the semiconductor device and second end coupled to a fourth terminal of the semiconductor device. The third conductive trace is wound around the first and second conductive traces to exhibit inductive properties. The second conductive trace has a different size or shape as the first conductive trace.

DETAILED DESCRIPTION OF THE DRAWINGS

Figure 1:
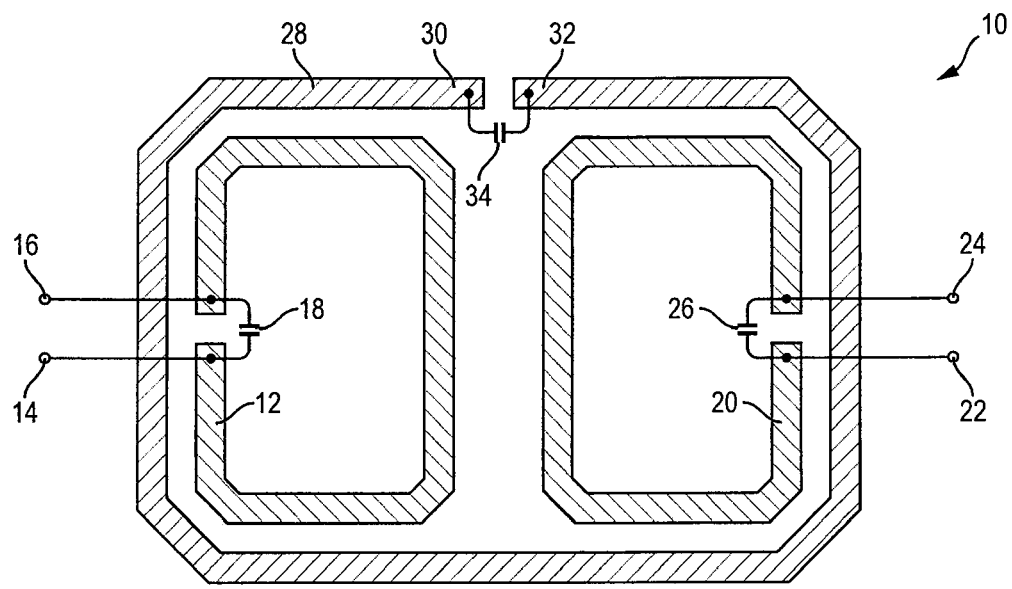
FIG. 1 is a conventional band-pass filter formed with LC resonators.
Figure 2:
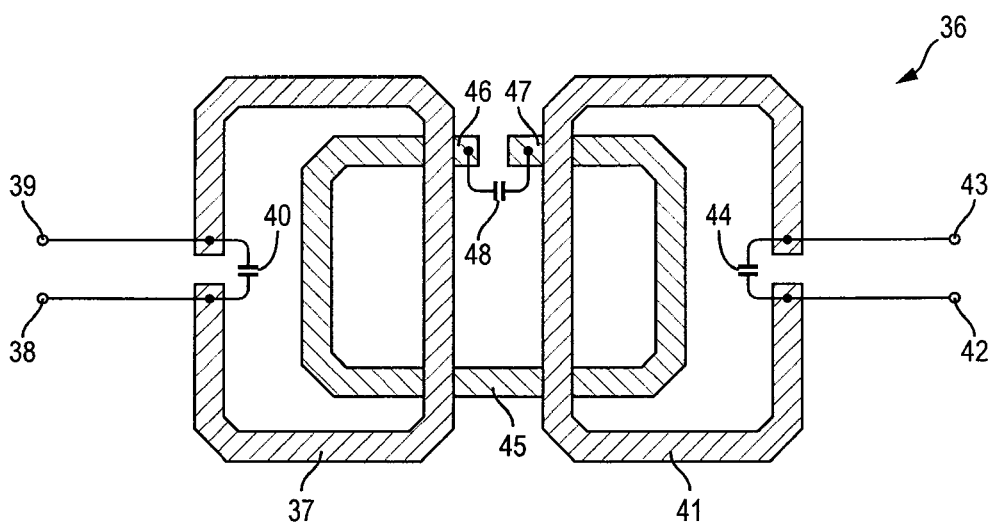
FIG. 2 is another conventional band-pass filter formed with LC resonators.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 3:
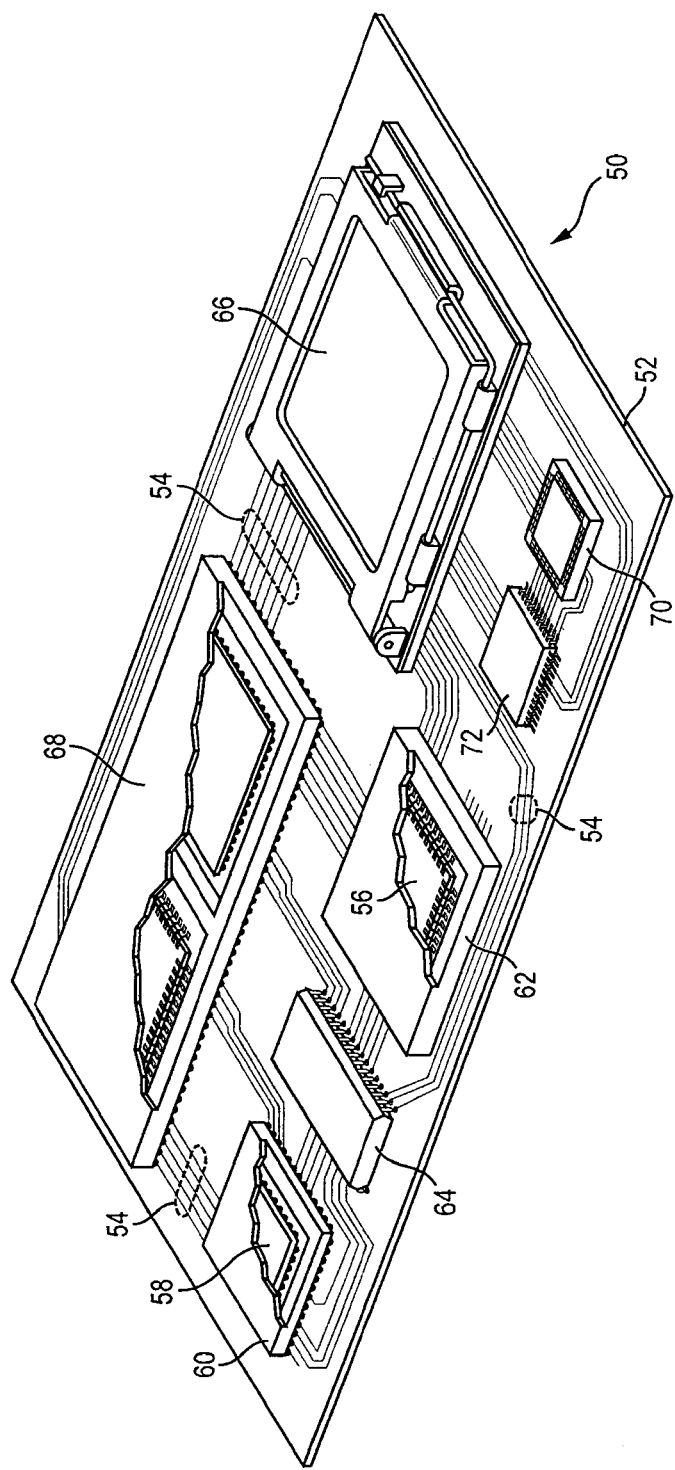
FIG. 3 illustrates a PCB with different types of packages mounted to its surface.

FIG. 3 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 3 for purposes of illustration.

Electronic device 50 may be a stand-alone system that uses the semiconductor packages to perform one or more electrical functions. Alternatively, electronic device 50 may be a sub-component of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 3, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 4A:
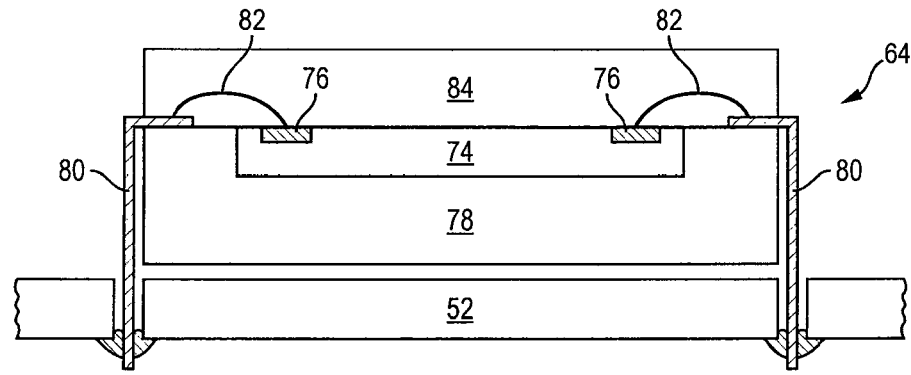
FIGS. 4a-4c illustrate further detail of the representative semiconductor packages mounted to the PCB.
Figure 4B:
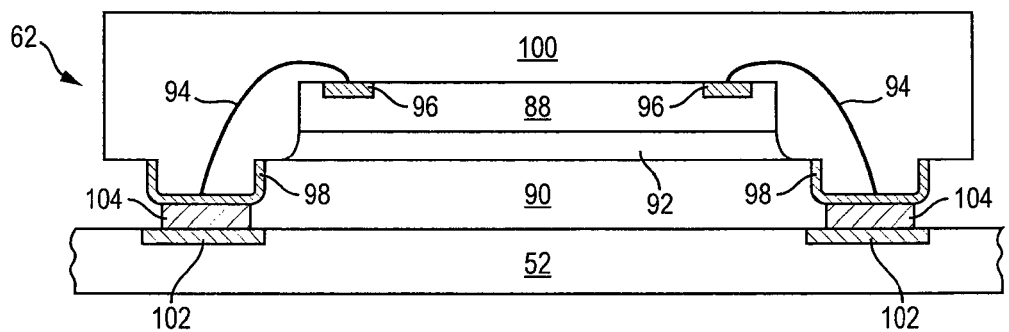
Figure 4C:
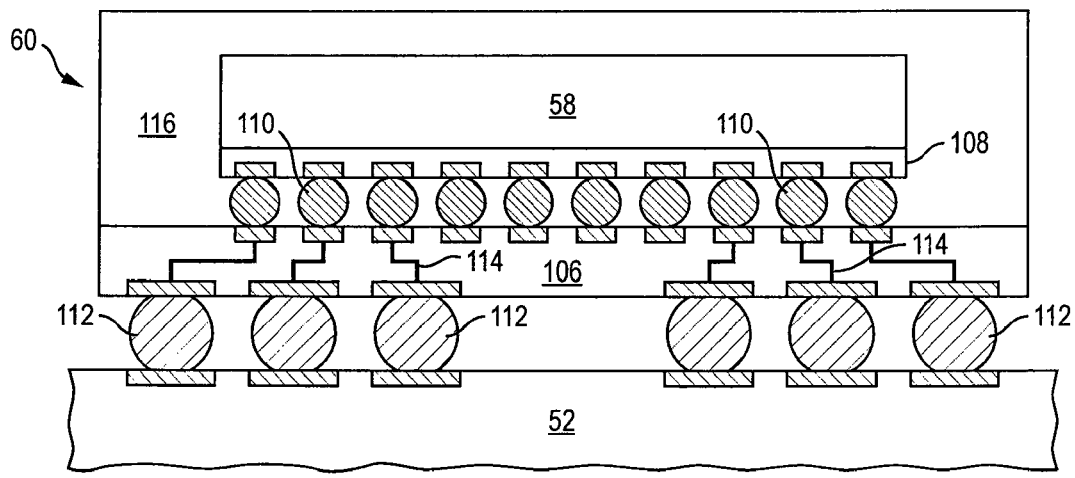

FIGS. 4a-4c show exemplary semiconductor packages. FIG. 4a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 4b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 4c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 5:
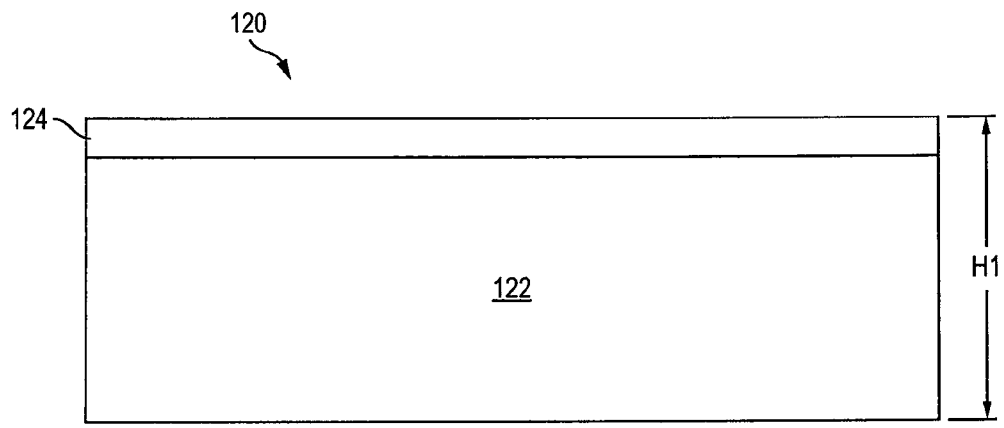
FIG. 5 illustrates a semiconductor die with an integrated passive device formed on the active surface.

In FIG. 5, semiconductor die or package 120 is shown, in relation to FIGS. 3 and 4a-4c, as having a semiconductor substrate 122 made with a base material such as silicon (Si), germanium, gallium arsenide (GaAs), glass, low temperature co-fired ceramic (LTCC), PCB, or other bulk semiconductor material for structural support. An active region 124 is formed over the top surface of semiconductor substrate 122. Active region 124 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface of the die to implement analog circuits or digital circuits. Semiconductor die 122 also contain one or more IPDs, such as thin film inductors, capacitors, and resistors, for RF signal processing. Active region 124 occupies about 5-10% of the overall thickness or height H1 of semiconductor die 120. In one embodiment, semiconductor die 120 occupies an area 2.0 millimeters (mm) by 1.3 mm by 0.4 mm. Semiconductor die 120 can be electrically connected to other devices using flipchip, bond wires, or interconnect pins.

Semiconductor devices containing a plurality of IPDs can be used in high frequency applications, such as microwave radar, telecommunications, wireless transceivers, electronic switches, and other devices performing RF electrical functions. The IPDs provide the electrical characteristics for circuit functions such as baluns, resonators, high-pass filters, low-pass filters, band-pass filters (BPF), symmetric Hi-Q resonant transformers, matching networks, RF couplers, and tuning capacitors. For example, the IPDs can be used as front-end wireless RF components, which can be positioned between the antenna and transceiver. The balun suppresses electrical noise, performs impedance transformation and matching, and minimizes common-mode noise through electromagnetic coupling. In some applications, multiple baluns are formed over a common substrate, allowing multi-band operation. For example, two or more baluns are used in a quad-band for mobile phones or other GSM communications, each balun dedicated for a frequency band of operation of the quad-band device. A band-pass filter can be used to reject harmonic content in the output signal outside the pass-band. A typical RF system requires multiple IPDs and other high frequency circuits in one or more semiconductor packages to perform the necessary electrical functions. The wireless application can be a cellular phone using multiple band operation, such as wideband code division multiple access (WCDMA) bands (PCS, IMT, low) and global system mobile communication (GSM) bands (low and high).

Figure 6:
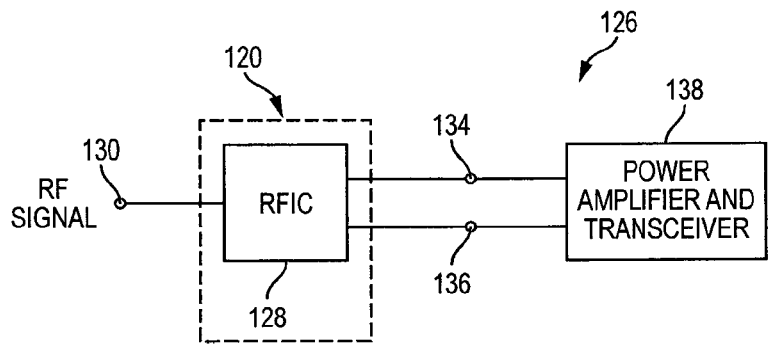
FIG. 6 illustrates a wireless communication system with integrated band-pass filter connected to power amplifier and transceiver.

FIG. 6 illustrates a wireless communication system 126 using an RF integrated circuit (RFIC) 128. RFIC 128 contains an RF band-pass filter as IPDs integrated on substrate 122 of a single semiconductor die 120. For example, the RF band-pass filter may operate in the 2.46-2.69 GHz band. RFIC 128 receives RF signal on terminal 130 and provides a band-pass filtered RF signal on differential ports 134 and 136 to power amplifier (PA) and transceiver 138. PA and transceiver 138 amplifies the filtered RF signal for transmission and receive RF signals in full-duplex, and filter and condition the signals for further processing.

Figure 7:
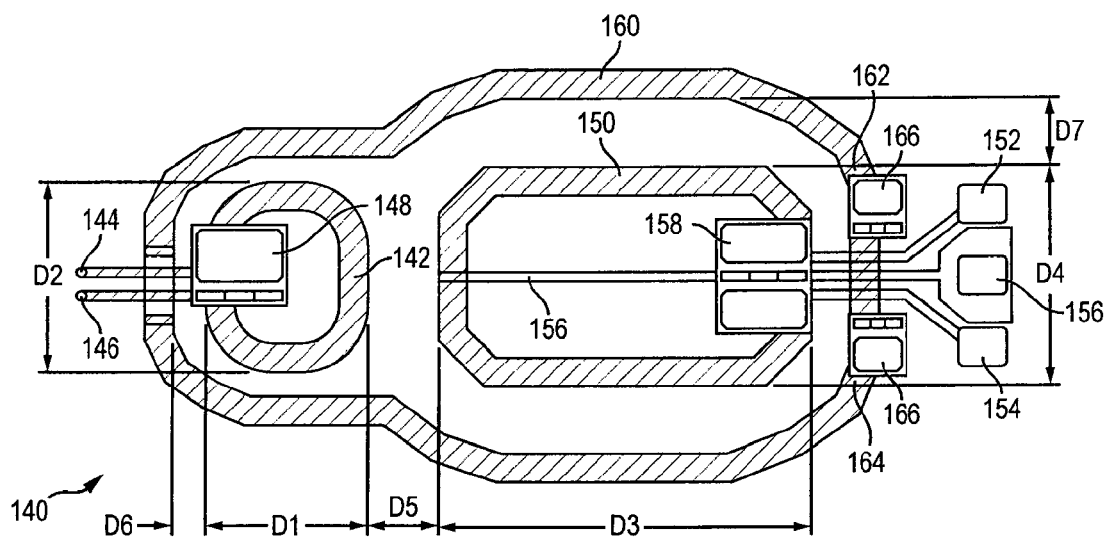
FIG. 7 illustrates further detail of the integrated RF band-pass filter.

Further detail of RFIC 128 with integrated RF band-pass filter 140 is shown in FIG. 7 implemented using LC resonators. A conductive trace or coil 142 is wound to exhibit inductive properties and includes first and second end terminals coupled to port 144 and port 146. In one embodiment, port 144 is a single-ended unbalanced port and port 146 is a ground terminal. Alternatively, port 146 is a single-ended unbalanced port and port 144 is the ground terminal. A capacitor 148 is coupled between port 144 and port 146. The inductor 142 and capacitor 148 constitute a first LC resonator. A conductive trace or coil 150 is wound to exhibit inductive properties and includes first and second end terminals coupled to balanced ports 152 and 154. A center tap terminal 156 is coupled midway between the first and second terminals of inductor 150. The center-tap terminal 156 is a virtual ground, with no current flowing in differential mode. A capacitor 158 is coupled between balanced ports 152 and 154. The inductor 150 and capacitor 158 constitute a second LC resonator. A conductive trace or coil 160 is wound to exhibit inductive properties and includes end terminals 162 and 164. A capacitor 166 is coupled in series with end terminals 162 and 164 of inductor 160. The inductor 160 and capacitor 166 constitute a third LC resonator.

The inductor 160 is disposed around a perimeter of inductors 142 and 150 non-overlapping with planar separation. The inductor 142 is a different size and/or shape with respect to inductor 150. In one embodiment, conductive trace 142 is 30-50 micrometers (μm) in width and formed in an oval shape with outer dimensions of D1=200 μm and D2=400 μm. Conductive trace 150 is 30-50 μm in width and formed in a rectangular shape with rounded corners and outer dimensions of D3=600 μm and D4=400 μm. The inductor 142 is separated from inductor 150 by D5=100 μm; inductor 142 is separated from inductor 160 by D6=50 μm; inductor 150 has maximum separation from inductor 160 of D7=100 μm. The inductors 142 and 150 can also have circular, polygonal, or conformal shape for enhanced Q-factor and reduced die area. The different sized inductors 142 and 150 create different port impedance.

Figure 8:
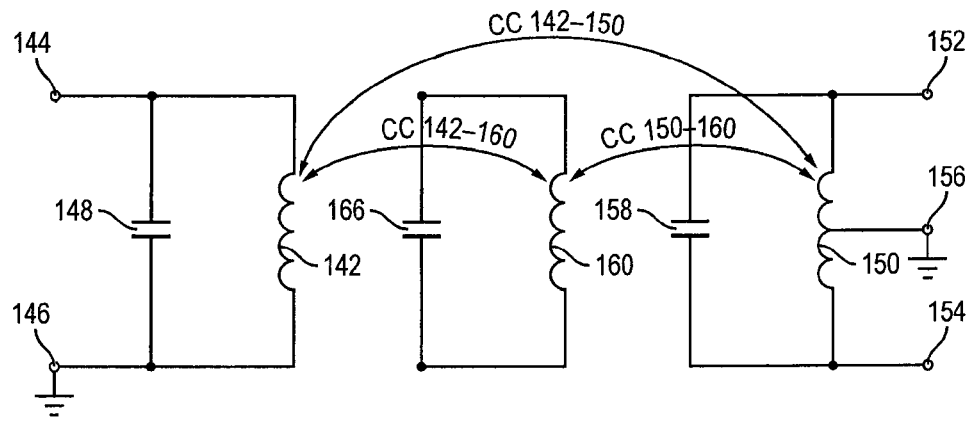
FIG. 8 illustrates a schematic circuit diagram of the RF band-pass filter.

FIG. 8 shows an electrical schematic diagram of RF band-pass filter 140 with inductors 142, 150, and 160 and capacitors 148, 158, and 166. The inductors 142, 150, and 160 are wound to create relatively small magnetic coupling between the inductors, e.g., coupling coefficients less than 0.2, for high attenuation in the rejection band. For example, the values of inductors 142, 150, and 160 are set to 0.46, 1.1, and 2.6 nanohenries (nH), respectively. The values of capacitor 148, 158, and 166 are set to 8.5, 3.6, and 1.7 picofarads (pF), respectively. The coupling coefficients between inductors 142 and 160 is CC142-160=0.13, between inductors 150 and 160 is CC150-160=0.13, and between inductors 142 and 150 is CC142-150=0.04. The coupling between inductors 142 and 160 decreases by increasing D6, resulting in a narrower passband response, particularly at the high frequency edge of the response. The coupling between inductors 150 and 160 increases by decreasing D5, and the attenuation pole at the lower side of the pass-band moves to a high frequency, resulting in a narrower bandwidth, with higher rejection. The coupling coefficients between inductors 150 and 160 should match the coupling between inductors 142 and 150. The topology provides balanced operation with the center-tapped LC resonator 150, 158.

Figure 9:
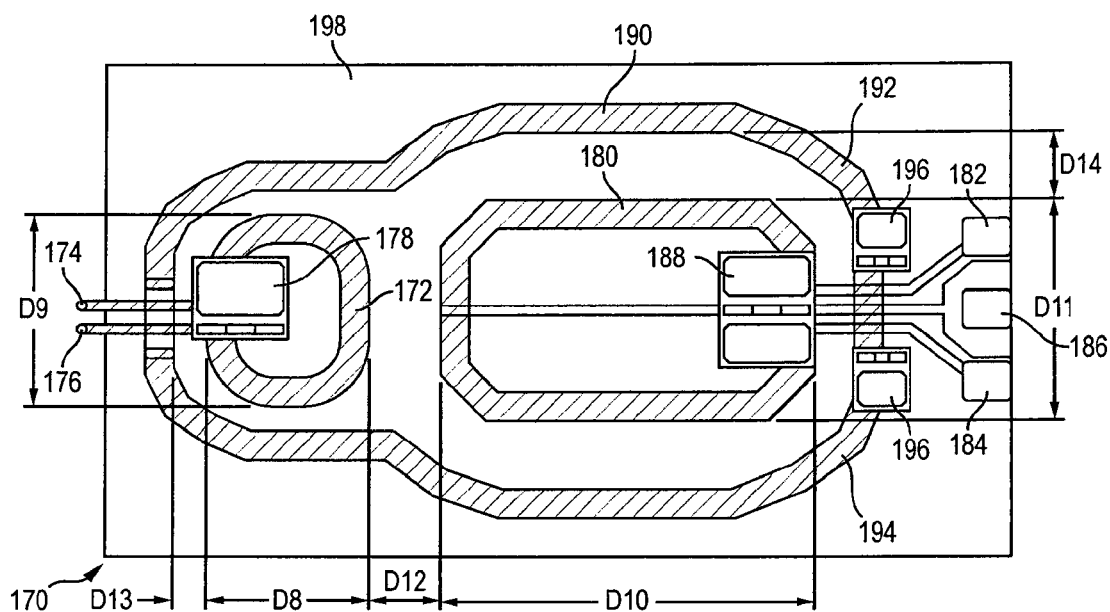
FIG. 9 illustrates another embodiment of the integrated RF band-pass filter.

In another embodiment, an integrated RF band-pass filter 170 is shown in FIG. 9 implemented using LC resonators. A conductive trace or coil 172 is wound to exhibit inductive properties and includes first and second end terminals coupled to port 174 and port 176. In one embodiment, port 174 is a single-ended unbalanced port and port 176 is a ground terminal. Alternatively, port 176 is a single-ended unbalanced port and port 174 is the ground terminal. A capacitor 178 is coupled between port 174 and port 176. The inductor 172 and capacitor 178 constitute a first LC resonator. A conductive trace or coil 180 is wound to exhibit inductive properties and includes first and second end terminals coupled to balanced ports 182 and 184 and center tap terminal 186. The center-tap terminal 186 is a virtual ground, with no current flowing in differential mode. A capacitor 188 is coupled between balanced ports 182 and 184. The inductor 180 and capacitor 188 constitute a second LC resonator. A conductive trace or coil 190 is wound to exhibit inductive properties and includes end terminals 192 and 194. A capacitor 196 is coupled in series with end terminals 192 and 194 of inductor 190. The inductor 190 and capacitor 196 constitute a third LC resonator. A co-plane ground structure 198 is formed around inductor 190 to facilitate G-S-G probe measurements.

The inductor 190 is disposed around a perimeter of inductors 172 and 180 non-overlapping with planar separation. The inductor 172 is a different size and/or shape with respect to inductor 180. In one embodiment, conductive trace 172 is 30-50 μm in width and formed in an oval shape with outer dimensions of D8=200 μm and D9=400 μm. Conductive trace 180 is 30-50 μm in width and formed in a rectangular shape with rounded corners and outer dimensions of D10=600 μm and D11=400 μm. The inductor 172 is separated from inductor 180 by D12=100 μm; inductor 172 is separated from inductor 180 by D13=50 μm; inductor 180 has maximum separation from inductor 190 of D14=100 μm. The inductors 142 and 150 can also have circular, polygonal, or conformal shape for enhanced Q-factor and reduced die area. The different sized inductors 142 and 150 create different port impedance.

Figure 10:
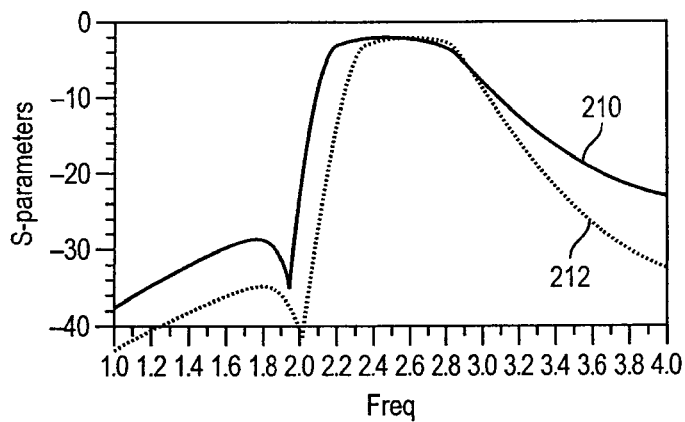
FIG. 10 is a waveform plot of insertion loss and attenuation versus frequency for the integrated RF band-pass filter.
Figure 11:
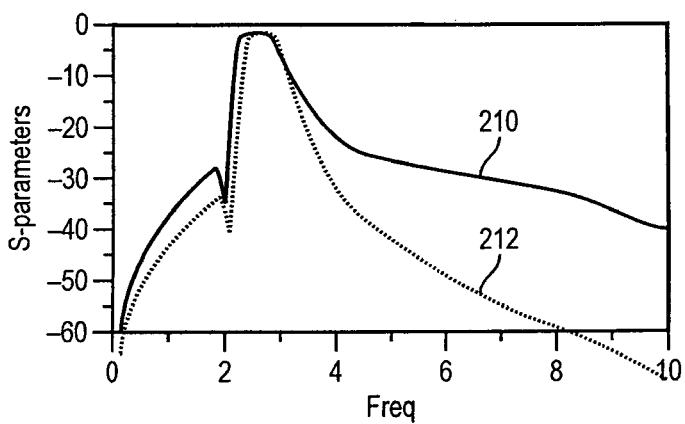
FIG. 11 is a waveform plot of insertion loss and attenuation over a wider frequency for the integrated RF band-pass filter.
Figure 12:
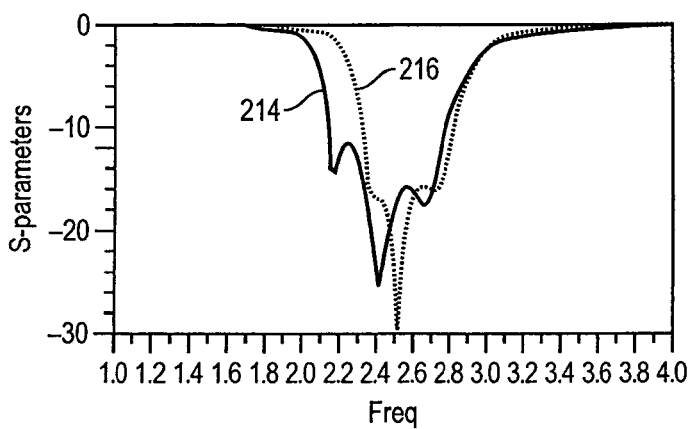
FIG. 12 is a waveform plot of return loss versus frequency for the integrated RF band-pass filter.

FIGS. 10-12 show comparison waveform plots of S-parameters expressed in dB versus frequency expressed in GHz for the 2.46-2.69 GHz band-pass filter. FIG. 10 is insertion loss and attenuation with line 210 representing the RF band-pass filter implementation (equal size and shape inductors) of prior art FIG. 1, and line 212 representing the RF band-pass filter implementation (non-equal size and shape inductors) of the present invention embodiment in FIG. 7. FIG. 11 is the insertion loss and attenuation of FIG. 10 with wider frequency range. The line 212 shows higher attenuation outside the 2.46-2.69 GHz pass-band as compared to line 210. For example, at 2.1 GHz (WCDMA), line 212 has −25 dB attenuation as compared to line 210 with −10 dB attenuation. Likewise, at 5 GHz (WiFi high band), line 212 has −43 dB attenuation as compared to line 210 with −28 dB attenuation. FIG. 12 is return loss with line 214 representing the RF band-pass filter implementation (equal size and shape inductors) of prior art FIG. 1, and line 216 representing the RF band-pass filter implementation (non-equal size and shape inductors) of the present invention embodiment in FIG. 7.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a substrate; and
   a band-pass filter formed over the substrate, the band-pass filter including,
   (a) a first conductive trace wound to exhibit an inductive property,
   (b) a second conductive trace wound to exhibit an inductive property, the second conductive trace having no overlapping portion with the first conductive trace and including a different size and shape than the first conductive trace, and
   (c) a third conductive trace wound around the first and second conductive traces to exhibit an inductive property with a first distance between the third conductive trace and the first conductive trace and a second distance different than the first distance between the third conductive trace and the second conductive trace.

2. The semiconductor device of claim 1, further including:
   a first capacitor coupled between first and second ends of the first conductive trace;
   a second capacitor coupled between first and second ends of the second conductive trace; and
   a third capacitor coupled between first and second ends of the third conductive trace.

3. The semiconductor device of claim 1, wherein the first and second conductive traces each have an oval, circular, polygonal, or conformal shape.

4. The semiconductor device of claim 1, wherein the first and second conductive traces have a coupling coefficient less than 0.2, and the first and third conductive traces have a coupling coefficient less than 0.2, and the second and third conductive traces have a coupling coefficient less than 0.2.

5. The semiconductor device of claim 1, further including a center tap coupled midway between the first and second ends of the second conductive trace.

6. A semiconductor device, comprising:
   a substrate;
   a first conductive trace formed over the substrate and wound to exhibit an inductive property;
   a second conductive trace formed over the substrate and wound to exhibit an inductive property, the second conductive trace being disposed over the substrate outside a perimeter of the first conductive trace and inductively coupled with the first conductive trace and including a different size and shape than the first conductive trace; and
   a third conductive trace formed over the substrate and wound around the first and second conductive traces to exhibit an inductive property.

7. The semiconductor device of claim 6, further including:
   a first capacitor formed over the substrate and coupled between first and second ends of the first conductive trace; and
   a second capacitor formed over the substrate and coupled between first and second ends of the second conductive trace.

8. The semiconductor device of claim 7, further including a third capacitor formed over the substrate and coupled between first and second ends of the third conductive trace.

9. The semiconductor device of claim 6, wherein the first and second conductive traces each have an oval, circular, polygonal, or conformal shape.

10. The semiconductor device of claim 6, wherein the first and second conductive traces have a coupling coefficient less than 0.2, and the first and third conductive traces have a coupling coefficient less than 0.2, and the second and third conductive traces have a coupling coefficient less than 0.2.

11. The semiconductor device of claim 6, further including a center tap coupled midway between first and second ends of the second conductive trace.

12. A semiconductor device, comprising:
    a substrate;
    a first inductor disposed over the substrate;
    a second inductor disposed over the substrate outside a perimeter of the first inductor and inductively coupled with the first inductor and including a different size and shape than the first inductor, the first inductor being disposed over the substrate outside a perimeter of the second inductor; and
    a third inductor formed around the first and second inductors.

13. The semiconductor device of claim 12, wherein the first inductor includes a first conductive trace wound to exhibit an inductive property.

14. The semiconductor device of claim 13, wherein the second inductor includes a second conductive trace wound to exhibit an inductive property.

15. The semiconductor device of claim 14, wherein the third inductor includes a third conductive trace wound to exhibit an inductive property.

16. The semiconductor device of claim 15, further including:
    a first capacitor formed over the substrate and coupled between first and second ends of the first conductive trace; and
    a second capacitor formed over the substrate and coupled between first and second ends of the second conductive trace.

17. The semiconductor device of claim 16, further including a third capacitor formed over the substrate and coupled between first and second ends of the third conductive trace.

18. The semiconductor device of claim 14, wherein the first and second conductive traces each have an oval, circular, polygonal, or conformal shape.

19. The semiconductor device of claim 14, further including a center tap coupled midway between the first and second ends of the second conductive trace.

20. A method of forming a semiconductor device, comprising:
    providing a substrate;
    forming a first conductive trace over the substrate and wound to exhibit an inductive property;
    forming a second conductive trace over the substrate and wound to exhibit an inductive property, the second conductive trace being disposed over the substrate outside a perimeter of the first conductive trace and including a different size and shape than the first conductive trace, the first conductive trace being disposed over the substrate outside a perimeter of the second conductive trace; and
    forming a third conductive trace over the substrate and wound around the first and second conductive traces to exhibit an inductive property.

21. The method of claim 20, further including:
    forming a first capacitor over the substrate and coupled between first and second ends of the first conductive trace; and
    forming a second capacitor over the substrate and coupled between first and second ends of the second conductive trace.

22. The method of claim 21, further including forming a third capacitor over the substrate and coupled between first and second ends of the third conductive trace.

23. The method of claim 22, wherein the first, second, and third conductive traces, and first, second, and third capacitors operate as a band-pass filter.

24. The method of claim 20, wherein the first and second conductive traces each have an oval, circular, polygonal, or conformal shape.

25. The method of claim 20, further including a center tap coupled midway between the first and second ends of the second conductive trace.

26. A method of making a semiconductor device, comprising:
    providing a substrate;
    disposing a first inductor over the substrate;
    disposing a second inductor over the substrate outside a perimeter of the first inductor and inductively coupled with the first inductor and including a different size and shape than the first inductor, and the first inductor disposed over the substrate outside a perimeter of the second inductor; and
    forming a third inductor around the first and second inductors.

27. The method of claim 26, wherein the first inductor includes a first conductive trace wound to exhibit an inductive property, the second inductor includes a second conductive trace wound to exhibit an inductive property, the third inductor includes a third conductive trace wound to exhibit an inductive property.

28. The method of claim 27, further including:
forming a first capacitor over the substrate between first and second ends of the first conductive trace; and
forming a second capacitor over the substrate between first and second ends of the second conductive trace.

29. The method of claim 28, further including forming a third capacitor over the substrate between first and second ends of the third conductive trace.

30. The method of claim 27, wherein the first and second conductive traces each have an oval, circular, polygonal, or conformal shape.

31. The method of claim 27, further including providing a center tap midway between first and second ends of the second conductive trace.

32. The method of claim 27, wherein the first and second conductive traces have a coupling coefficient less than 0.2, and the first and third conductive traces have a coupling coefficient less than 0.2, and the second and third conductive traces have a coupling coefficient less than 0.2.

\* \* \* \* \*